(12) United States Patent
Jiang et al.

(10) Patent No.: US 11,101,452 B2
(45) Date of Patent: Aug. 24, 2021

(54) PACKAGING DEVICE AND DISPLAY PANEL PACKAGING METHOD

(71) Applicants: BOE Technology Group Co., Ltd., Beijing (CN); Ordos Yuansheng Optoelectronics Co., Ltd., Ordos (CN)

(72) Inventors: Zhiliang Jiang, Beijing (CN); Zhenli Zhou, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 596 days.

(21) Appl. No.: 16/075,251

(22) PCT Filed: Dec. 15, 2017

(86) PCT No.: PCT/CN2017/116454
§ 371 (c)(1),
(2) Date: Aug. 3, 2018

(87) PCT Pub. No.: WO2018/196402
PCT Pub. Date: Nov. 1, 2018

(65) Prior Publication Data
US 2021/0202919 A1    Jul. 1, 2021

(30) Foreign Application Priority Data
Apr. 28, 2017  (CN) .......................... 201710293818.0

(51) Int. Cl.
*H01L 51/56* (2006.01)
*H01L 51/52* (2006.01)

(52) U.S. Cl.
CPC .......... *H01L 51/56* (2013.01); *H01L 51/5253* (2013.01)

(58) Field of Classification Search
CPC . H01L 51/56; H01L 51/5246; H01L 51/5253; H01L 224/8385–8389
See application file for complete search history.

(56) References Cited

U.S. PATENT DOCUMENTS

| 10,748,855 B2 * | 8/2020 | Kim ........................ B32B 37/10 |
| 2007/0196588 A1 * | 8/2007 | Shinjo ..................... H01L 24/27 |
| | | 427/457 |

(Continued)

FOREIGN PATENT DOCUMENTS

| CN | 1971972 A | 5/2007 |
| CN | 103855328 A | 6/2014 |

(Continued)

OTHER PUBLICATIONS

International Search Report (including English translation) mailed in PCT/CN2017/116454, dated Mar. 15, 2018.

*Primary Examiner* — Shaun M Campbell
(74) *Attorney, Agent, or Firm* — Fay Sharpe LLP

(57) ABSTRACT

Provided are a packaging device and a display panel packaging method. The device includes: a guide line, a container for containing a package adhesive, a rotary worktable for placing a to-be-packaged device and a winding device for driving the guide line to move. The guide line is mounted on the winding device, and part of the guide line is immerged into the package adhesive so the guide line adhered by the package adhesive passes through the rotary worktable when moving. The to-be-packaged display device is disposed on rotary worktable, thus the guide line contacts with the frit. When the rotary worktable rotates, the guide line moves and passes through the container containing package adhesive. When part of the guide line adhered by package adhesive passes through the rotary worktable, the package adhesive is (Continued)

coated on the frit, thereby achieving uniform coating of the package adhesive under surface tension of frit.

20 Claims, 5 Drawing Sheets

(56) References Cited

U.S. PATENT DOCUMENTS

| | | | |
|---|---|---|---|
| 2008/0011412 A1* | 1/2008 | Tsujimoto | H01L 21/6835 |
| | | | 156/193 |
| 2020/0214143 A1* | 7/2020 | Price | H05K 3/323 |

FOREIGN PATENT DOCUMENTS

| | | |
|---|---|---|
| CN | 105572858 A | 5/2016 |
| CN | 106935534 A | 7/2017 |
| JP | 2015135781 A | 7/2015 |

* cited by examiner

PACKAGING DEVICE AND DISPLAY PANEL PACKAGING METHOD

This application is a 371 of PCT Patent Application Serial No. PCT/CN2017/116454, filed on Dec. 15, 2017, which claims priority to Chinese Patent Application No. 201710293818.0, filed with the State Intellectual Property Office on Apr. 28, 2017 and titled "PACKAGING DEVICE AND DISPLAY PANEL PACKAGING METHOD", the entire contents of which are incorporated herein by reference.

TECHNICAL FIELD

The present disclosure relates to a packaging device and a display panel packaging method.

BACKGROUND

At present, common displays mainly include organic light-emitting displays (OLED) and liquid crystal displays (LCD). An OLED device is very sensitive to moisture and oxygen in an environment, which may deteriorate the performance of the OLED device. Thus, the OLED device needs to be packaged during its manufacture, so as to avoid erosion due to the moisture and oxygen in the environment. Hence, a packaging technology of the OLED device becomes a key process for prolonging its service life.

SUMMARY

There are provided in the present disclosure a packaging device and a display panel packaging method.

There is provided a packaging device in at least one embodiment of the present disclosure. The device includes: a guide line, a container configured to contain a package adhesive, a rotary worktable configured to place a to-be-packaged device and a winding device configured to drive the guide line to move, where the guide line is mounted on the winding device, and part of the guide line is configured to be immerged into the package adhesive, so that the guide line to which the package adhesive is adhered passes through the rotary worktable when moving.

In an implementation of an embodiment of the present disclosure, the winding device includes at least two rotating members, both ends of the guide line are connected to each other, the guide line is configured to move under drive of the at least two rotating members, and the container is disposed on a movement path of the guide line.

In another implementation of an embodiment of the present disclosure, the rotary worktable is disposed on the movement path of the guide line.

In another implementation of an embodiment of the present disclosure, the packaging device further includes a recovery unit configured to recover the package adhesive on the guide line and disposed on the movement path of the guide line.

In another implementation of an embodiment of the present disclosure, the recovery unit includes a tank body and two rollers that are disposed in parallel, the guide line is sandwiched between the two rollers, length directions of rotation axes of the two rollers are perpendicular to a movement direction of the guide line when the guide line passes through the recovery unit, and the two rollers are located above the tank body.

In another implementation of an embodiment of the present disclosure, the at least two rotating members include at least one rotating wheel and at least one guiding wheel, the rotating wheel is configured to rotate under drive of a power unit, and the guiding wheel is configured to rotate under drive of the guide line.

In another implementation of an embodiment of the present disclosure, a pulley is disposed in the container, and the guide line passes around the pulley.

In another implementation of an embodiment of the present disclosure, two through holes are oppositely formed in a side wall of the container, and the guide line sequentially passes one of the two through holes, the pulley and the other one of the two through holes.

In another implementation of an embodiment of the present disclosure, heights of the through holes are higher than a liquid level of package adhesive.

In another implementation of an embodiment of the present disclosure, the pulley is disposed at a bottom of the container, and a distance between the pulley and the bottom of the container is less than a distance between a through hole and the bottom of the container.

In another implementation of an embodiment of the present disclosure, the guide line is a silk line.

In another implementation of an embodiment of the present disclosure, the guide line is a round line or a flat line.

In another implementation of an embodiment of the present disclosure, the guide line has a diameter of about 0.5 mm when the guide line is the round line, and the guide line has a width of about 0.5 mm when the guide line is the flat line.

In another implementation of an embodiment of the present disclosure, the packaging device further includes a control unit configured to control the rotary worktable to rotate.

In another implementation of an embodiment of the present disclosure, the control unit is configured to control the rotary worktable to rotate at a constant speed when the to-be-packaged device is in a round shape, and to control the rotary worktable to rotate intermittently by 90 degrees every time when the to-be-packaged device is in a square shape.

In another implementation of an embodiment of the present disclosure, the control unit is further configured to control the winding device to move so as to control a movement of the guide line.

There is further provided a display panel packaging method in at least one embodiment of the present disclosure. The method is realized by the packaging device according to the first aspect and includes:

placing a to-be-packaged display panel on a rotary worktable to ensure that the to-be-packaged display panel is in contact with a guide line;

controlling the rotary worktable to rotate, and simultaneously controlling the guide line to move, so as to coat the to-be-packaged display panel with a package adhesive; and processing the to-be-packaged display panel coated with the package adhesive, so as to ensure that the package adhesive is cured.

In an implementation of an embodiment of the present disclosure, the controlling the rotary worktable to rotate includes:

controlling the rotary worktable to rotate at a constant speed when the to-be-packaged display panel is in a round shape; and controlling the rotary worktable to rotate intermittently by 90 degrees every time when the to-be-packaged display panel is in a square shape.

In another implementation of an embodiment of the present disclosure, the display panel is an organic light-emitting display panel.

DETAILED DESCRIPTION

The present disclosure will be described in further detail with reference to the accompanying drawings, to clearly present the principles and advantages of the present disclosure.

In the packaging technology of the OLED device, a frit and an ultraviolet rays curing adhesive (UV adhesive) are adopted to package the OLED device. During a packaging process, the frit is adopted to package the OLED device first. After that, the UV adhesive is adopted for packaging in the following packaging process (taking a square OLED device as an example). The OLED device is fixed on a tooling to ensure that any side, coated with the frit, of the OLED device faces a UV adhesive dispensing device located above the tooling. The UV adhesive dispensing device drips the UV adhesive onto the frit of the OLED device. After finishing the dripping on one side of the OLED device and the UV adhesive thereon is fully filled in the frit, the OLED device is detached and rotated by 90 degrees, then re-fixed thereafter. The above steps are repeated until the UV adhesive is dripped on all of four sides of the OLED device. The UV adhesive is irradiated by the ultraviolet rays to be cured, so as to complete the packaging.

However, regarding the shape application range and coating uniformity of the OLED device, there are still rooms for improving the above-mentioned manner of dripping the UV adhesive.

Figure 1:
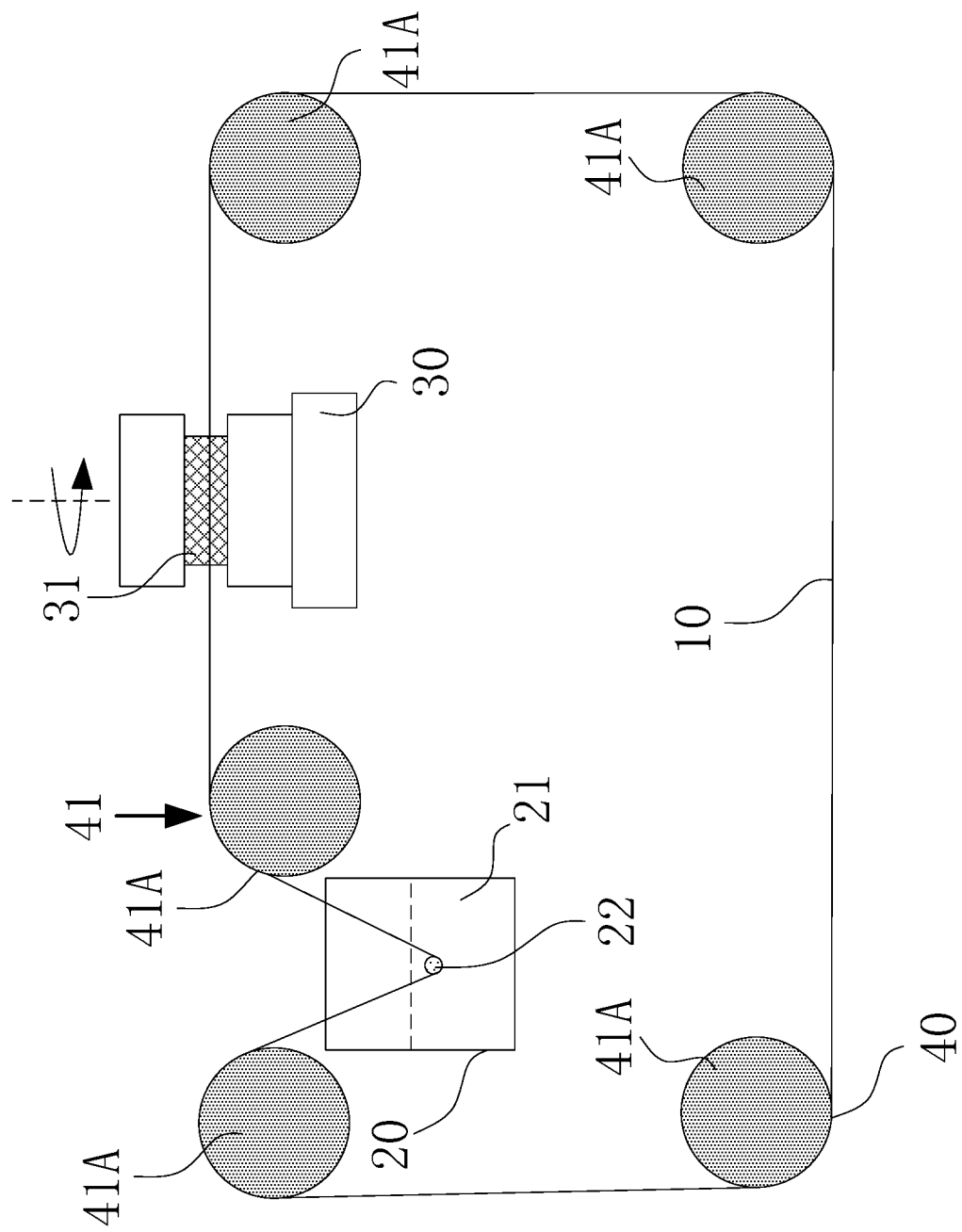
FIG. 1 is a schematic view of a structure of a packaging device provided by an embodiment of the present disclosure.

FIG. 1 is a schematic view of a structure of a packaging device provided by an embodiment of the present disclosure. Referring to FIG. 1, the packaging device includes: a guide line 10, a container 20 for containing a package adhesive, a rotary worktable 30 for placing a to-be-packed component 31 and a winding device 40 for driving the movement of the guide line 10. The guide line 10 is mounted on the winding device 40, and part of the guide line 10 is used to be immerged into the package adhesive 21, such that the guide line 10 to which the package adhesive is adhered passes through the rotary worktable 30 when moving.

The packaging device provided by the embodiment of the present disclosure is mainly used to package an OLED device, and of course, may also be applied to the packaging of other devices. That is, the to-be-packed device 31 may be a to-be-packaged OLED device or other to-be-packaged devices. In the following, the to-be-packaged OLED device will be taken as an example for description. During use, the package adhesive in the container may be replaced with other colloids or liquids in accordance with actual needs. When the above-mentioned packaging device is adopted to package the OLED device, the to-be-packaged OLED device is disposed on the rotary worktable, so that the guide line is in contact with the OLED device, and in particular, the guide line is in contact with the frit of the to-be-packaged OLED device. When the rotary worktable rotates and the guide line moves, part of the guide line is immerged into the package adhesive and passes through the container that contains the package adhesive during the movement, thus the package adhesive contained in the container is adhered onto the guide line after the guide line passes through the container. When the part, to which the package adhesive is adhered, of the guide line passes over the rotary worktable, the frit is coated with the package adhesive and filled (capillary action) through the surface tension of the frit. Under the action of surface tension of the frit, the adhesive amount between the guide line and the frit reaches a state of dynamic balance, so as to realize the uniform coating of the package adhesive, such that the packaging mechanical strength and the sealing performance of the OLED device are improved. In addition, the round OLED device is placed on the rotary worktable, so that the package can be completed by using the package adhesive. That is, the packaging device is applicable to the round OLED device. Of course, the packaging device may also be applicable to elliptical OLED devices and other OLED devices with curved side surfaces.

In an embodiment of the present disclosure, the package adhesive contained in the container 20 may be a UV adhesive.

As shown in FIG. 1, the package adhesive 21 is provided in the container 20. Part of the guide line 10 is used to be immerged into the package adhesive 21. In the operation of the packaging device, the other part of the guide line 10 is located above the rotary worktable. Of course, in other embodiments, the other part of the guide line 10 may also be located at a side edge or in other positions of the rotary worktable 30, as long as the guide line 10 can be in contact with the frit of the to-be-packaged OLED device placed on the rotary worktable 30. Different shape and size relationships between the rotary worktable 30 and the to-be-packaged OLED device may lead to different positions of the guide line 10. For example, when an upper surface area of the rotary worktable 30 is large and the to-be-packaged OLED device is disposed in the center of the upper surface of the rotary worktable, the other part of guide line 10 may be in contact with the frit of the to-be-packaged OLED device as long as the other part of the guide line 10 is located right above the rotary worktable 30. When the upper surface area of the rotary worktable 30 is small and a side wall of the to-be-packaged OLED device extends to the outside of the rotary worktable 30, the other part of guide line 10 may not be in contact with the frit of the to-be-packaged OLED device unless the other part of the guide line 10 is located at the side edge of the rotary worktable.

In an embodiment of the present disclosure, the winding device 40 may include at least two rotating members 41, and rotation axes of the rotating members 41 are mutually parallel. Both ends of the guide line 10 are connected to each other, and the guide line 10 is wound on the at least two rotating members 41, such that the guide line 10 may be driven to move by the winding device 40. The winding device formed by the at least two rotating members is adopted to wind the guide line, and by controlling the rotation of the rotating members 41, the guide line can be rotated circularly without being set too long, which facilitates the control of the guide line at the same time.

As shown in FIG. 1, a pulley 22 is provided inside the container 20. The guide line 10 passes around the pulley 22. The directions of the guide line 10 in and out the container 20 may be designed to ensure that the guide line may take away the package adhesive from the container 20. The pulley 22 is a fixed pulley which is fixed in the container 20. A rotation axis of the pulley is parallel to the rotation axes of the rotating members. Exemplarily, the guide line 10 may pass around the pulley 22 below the pulley 22. Meanwhile, the pulley 22 is in contact with the package adhesive, so as to ensure that the guide line 10 can not only be in full contact with the package adhesive but also cooperate with the pulley to smoothly enter or exit the container.

Furthermore, the pulley 22 may be disposed at a bottom of the container 20, such that the guide line 10 may be in full contact with the package adhesive in the container 20.

In an embodiment of the present disclosure, the container 20 may be in various shapes, such as a cylinder, a cuboid and etc., and may be made of different materials, such as plastic, glass, wood, metal and etc.

In an implementation of an embodiment of the present disclosure, the at least two rotating members may be all rotating wheels which are used to rotate and driven by a power unit (for example, a motor). As shown in FIG. 1, five rotating wheels 41A are included. When the winding device 40 includes two or more rotating wheels, linear speeds of the two or more rotating wheels are the same, thereby ensuring a smooth movement of the guide line.

In another implementation of the embodiment of the present disclosure, the at least two rotating members include at least one rotating wheel and at least one guiding wheel. The guiding wheel is used to rotate under the drive of the guide line. That is, the guiding wheel is not driven by a power unit and plays a guiding role, and the detail thereof can be seen in the following description of FIGS. 2-4.

Figure 2:
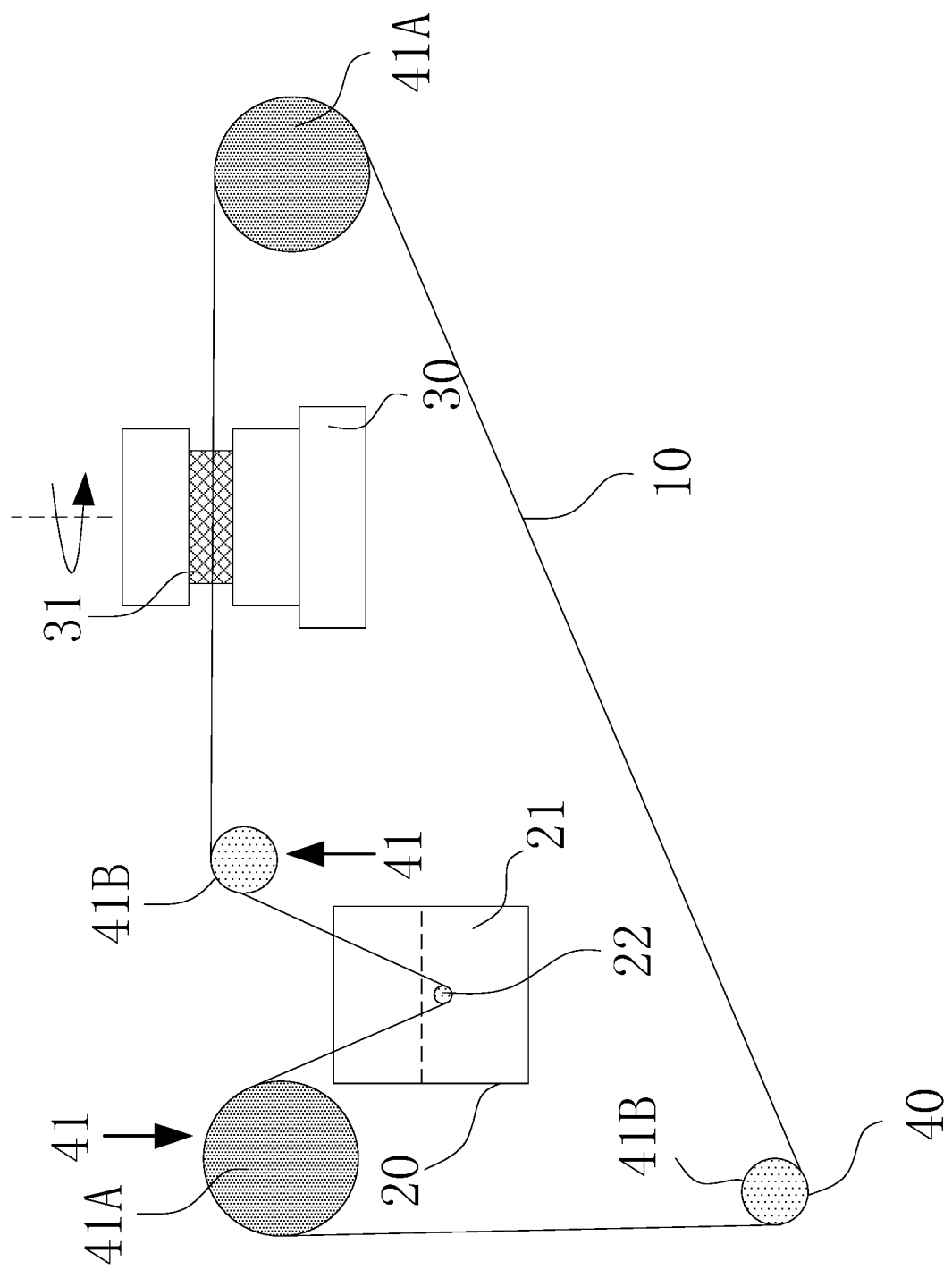
FIG. 2 is a schematic view of a structure of another packaging device provided by an embodiment of the present disclosure.

FIG. 2 is a schematic view of a structure of another packaging device provided by an embodiment of the present disclosure. Referring to FIG. 2, the packaging device therein differs from the packaging device shown in FIG. 1 in that a winding device 40 includes two rotating wheels 41A and two guiding wheels 41B. One of the guiding wheels 41B is disposed between the two rotating wheels 41A. The other guiding wheel 41B is disposed at one side of one of the rotating wheels 41A and forms a triangle with the rotating wheels 41A. A guide line 10 is wound around the two rotating wheels 41A and the two guiding wheels 41B, and used to move on the two rotating wheels 41A and the two guiding wheels 41B. A container 20 and a rotary worktable 30 are disposed on a movement path of the guide line 10.

As shown in FIG. 2, the container 20 and the rotary worktable 30 are disposed between the two rotating wheels 41A and sequentially disposed in a movement direction of the guide line. Exemplarily, the container 20 is disposed between one of the rotating wheels 41A and one of the guiding wheels 41B. The rotary worktable 30 is disposed between one of the guiding wheels 41B and the other rotating wheel 41A.

In an implementation, the winding device 40 only includes the two rotating wheels 41A, which is simple in structure, excellent in dynamic performance and small in size, and can meet the winding demand. In addition, the rotary worktable 30 is disposed on the movement path of the guide line 10. During the operation, an OLED device can be packaged without moving the position of the rotary worktable 30.

Figure 3:
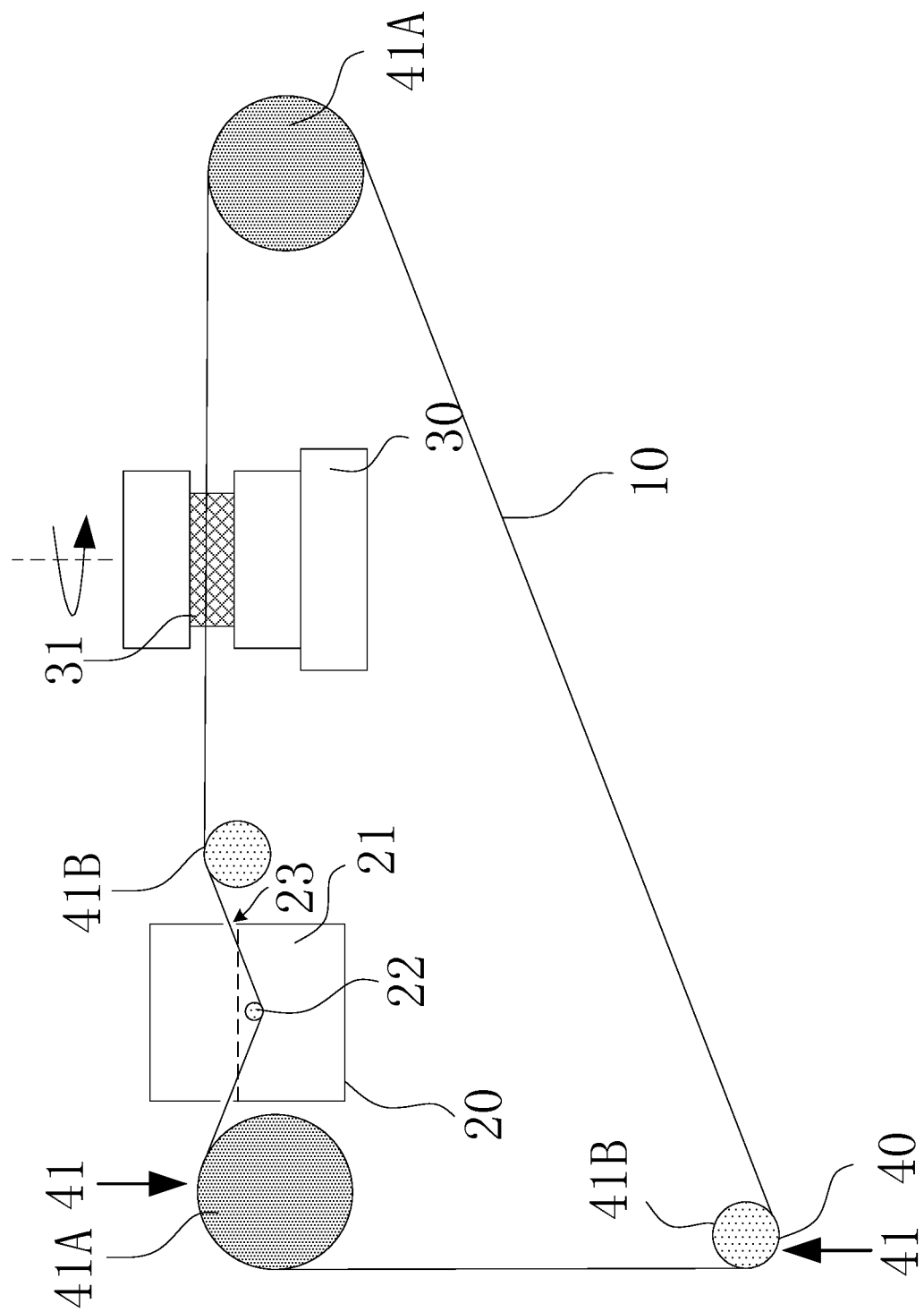
FIG. 3 is a schematic view of a structure of another packaging device provided by an embodiment of the present disclosure.

FIG. 3 is a schematic view of a structure of another packaging device provided by an embodiment of the present disclosure. Referring to FIG. 3, the packaging device therein differs from the packaging device shown in FIG. 2 in that two through holes 23 are oppositely disposed in a side wall of a container 20. A guide line 10 sequentially passes through one of the two through holes 23, a pulley 22 and the other one of the two through holes 23. The two through holes are formed on the side wall of the container, so as to prevent the package adhesive on the guide line from slipping due to a large inclination of the guide line, when the guide line enters and exits the container from a container opening (FIG. 2 shows entry and exiting of the guide line from the container opening). That is, the two through holes is set to make the inclination of the guide line small, and make the package adhesive be adhered to the guide line more stably, thereby ensuring the amount of the package adhesive finally coated on the frit, and further ensuring a packaging effect.

Herein, heights of the through holes are higher than a liquid level of the package adhesive, so as to prevent the package adhesive from flowing out of the through holes.

Particularly, the pulley 22 is disposed at a bottom of the container 20. A distance between the pulley and the bottom of the container 20 is less than a distance between the through holes 23 and the bottom of the container 20, thereby ensuring that the guide line 10 is in full contact with the package adhesive in the container 20.

Exemplarily, the heights (the distance between the through holes and the bottom of the container) of the two through holes 23 are the same, thereby facilitating the design and manufacture of the container on one hand, and facilitating the arrangement of the winding device, i.e., the guide line on the other hand.

Figure 4:
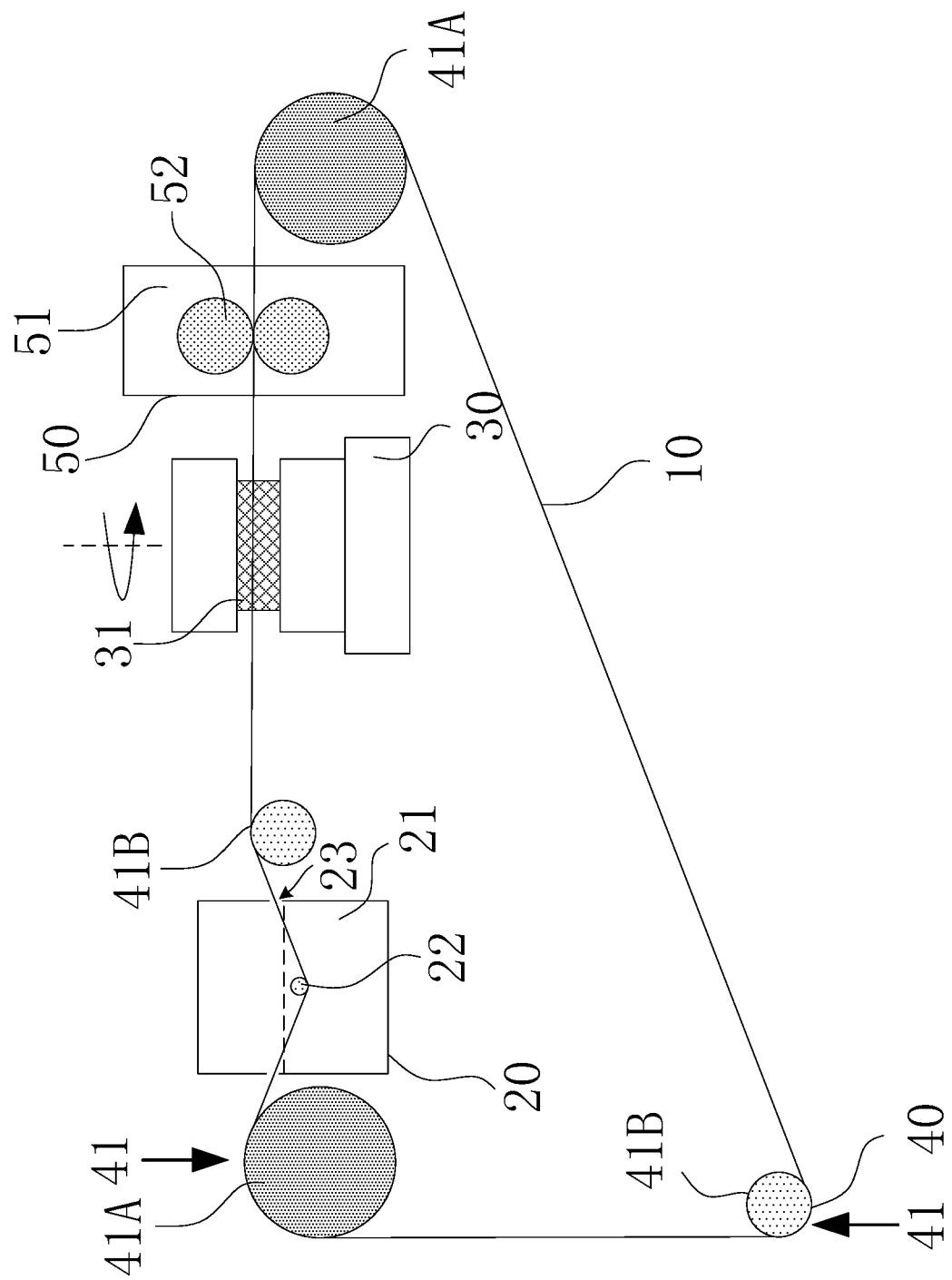
FIG. 4 is a schematic view of a structure of another packaging device provided by an embodiment of the present disclosure.

FIG. 4 is a schematic view of a structure of another packaging device provided by an embodiment of the present disclosure. Referring to FIG. 4, the packaging device herein differs from the packaging device provided by FIG. 3 in that, the packing device herein further includes a recovery unit 50 used for recovering a package adhesive 21 on a guide line 10. The recovery unit 50 is disposed on the movement path of the guide line 10. The reuse can be achieved by the recovery unit 50 through recovering the excess adhesive on the guide line.

Referring to FIG. 4, a rotary worktable 30 may be disposed between a container 20 and the recovery unit 50, thereby recovering the unused package adhesive which just passes through the rotary worktable 30.

Referring to FIG. 4, the recovery unit 50 includes a tank body 51 and two rollers 52 that are disposed in parallel. The guide line 10 is sandwiched between the two rollers 52. Axial directions of rotation axes of the two rollers are perpendicular to a movement direction of the guide line 10 when passing through the recovery unit 50. The two rollers 52 are located above the tank body 51. The two rollers move relative to each other when a silk line moves, and the two rollers squeeze the silk line when the silk line passes, so as to recover the excess adhesive on the silk line and realize the reuse. The recovery unit is simple in structure and may ensure the recovery of the package adhesive.

In the packaging device provided in FIGS. 1 to 4, the guide line 10 can be a silk line. As the silk line serves as the guide line, adhesion of the package adhesive may be realized, and an adhesion effect is good.

Furthermore, the guide line 10 may be a round line with a diameter of about 0.5 mm. Optionally, the guide line 10 may be a flat line with a width of about 0.5 mm. In an OLED device, a distance between a substrate and a cover plate is about 5 μm. That is, the height of a frit is 5 μm. The diameter or the width of the guide line 10 is larger than the height of the frit of the OLED device, such that the package adhesive on the guide line may cover the frit and a package demand can be met. As the diameter or the width of the guide line 10 is larger than the height of the frit of the OLED device, during the actual coating, the substrate and the cover plate may be coated with the package adhesive which needs to be removed in subsequent steps.

In an embodiment of the present disclosure, the coating thickness of the package adhesive may be about 0.15 mm. The amount of the package adhesive applied on an OLED device is 5 μm*0.15 mm*a perimeter of the OLED device. Taking the production data of 5.5 FHD as an example, 180 mL of the package adhesive may correspond to 20,000 OLED devices.

Furthermore, if the package adhesive on the guide line 10 is excessive and overflows when coating the frit, the package adhesive on the guide line needs to be reduced. Exemplarily, the packaging device may further include an adhesive filtering device used to filter out part of the package adhesive on the guide line. The adhesive filtering device may be disposed between the rotary worktable and the container and may also be disposed on a side wall of the container. For example, the adhesive filtering device includes an adhesive filtering plate that is vertically disposed between the rotary worktable and the container. An adhesive filtering hole is formed on the adhesive filtering plate. The guide line penetrates the adhesive filtering hole, so as to scrape part of the package adhesive on the guide line. Furthermore, a groove is formed at the bottom of the adhesive filtering plate, so as to recover the package adhesive. Of course, the other one of the two through holes 23 in the side wall of the container 20 may be designed as the adhesive filtering hole (the adhesive filtering device only includes the adhesive filtering hole). Exemplarily, the adhesive filtering hole may be disposed obliquely upwards, such that the package adhesive scraped by the adhesive filtering hole may be returned to the container. Herein, during the design of the adhesive filtering hole, a brush extending from the periphery of the adhesive filtering hole to the center thereof may be disposed in the adhesive filtering hole, so that on the one hand, the package adhesive may be partially scraped, and on the other hand, the guide line is not scratched.

The packaging device provided in FIGS. 1 to 4 further includes a control unit used to control the rotation of the rotary worktable 30, so as to ensure a normal operation of the packaging device.

Furthermore, the control unit is used to control the rotary worktable 30 to rotate at a constant speed when the to-be-packaged OLED device is round, and to control the rotary worktable 30 to rotate intermittently by 90 degrees every time when the to-be-packaged OLED device is square, thereby ensuring that the packaging device may be applicable to OLED devices in different shapes.

Furthermore, the control unit is used to control the winding device to move, so as to control the guide line to move. Exemplarily, the control unit is further used to control the rotational speed of the rotating member, so as to control the speed of the guide line. Exemplarily, the control unit is further used to control the power unit that drives the rotating wheel, so as to control the rotational speed of the rotating member. During the actual control, the rotational speed of the rotating member and the speed or intermittent time of the rotary worktable may be designed according to actual coating of the package adhesive, so as to ensure an appropriate coating amount of the package adhesive.

In addition, in an embodiment of the present disclosure, the rotary worktable 30 can be a movable rotary worktable which may be away from or close to the guide line through movement. When the OLED device is packaged, the guide line and the to-be-packaged OLED device are in contact through movement of the rotary worktable 30. Meanwhile, the movable rotary worktable can also place OLED devices with different sizes on the rotary worktable. The different sized OLED devices placed on the rotary worktable may be all in contact with the guide line, and will not cause the OLED devices to have excessive pressure on the guide line.

Furthermore, when the rotary worktable is a movable rotary worktable, the control unit may control the rotary worktable to rotate intermittently and further to be away from the guide line in an intermittent period, thereby preventing the square to-be-packaged OLED device from squeezing the guide line at a corner during a next rotation and causing the guide line to wear or even fractured.

Figure 5:
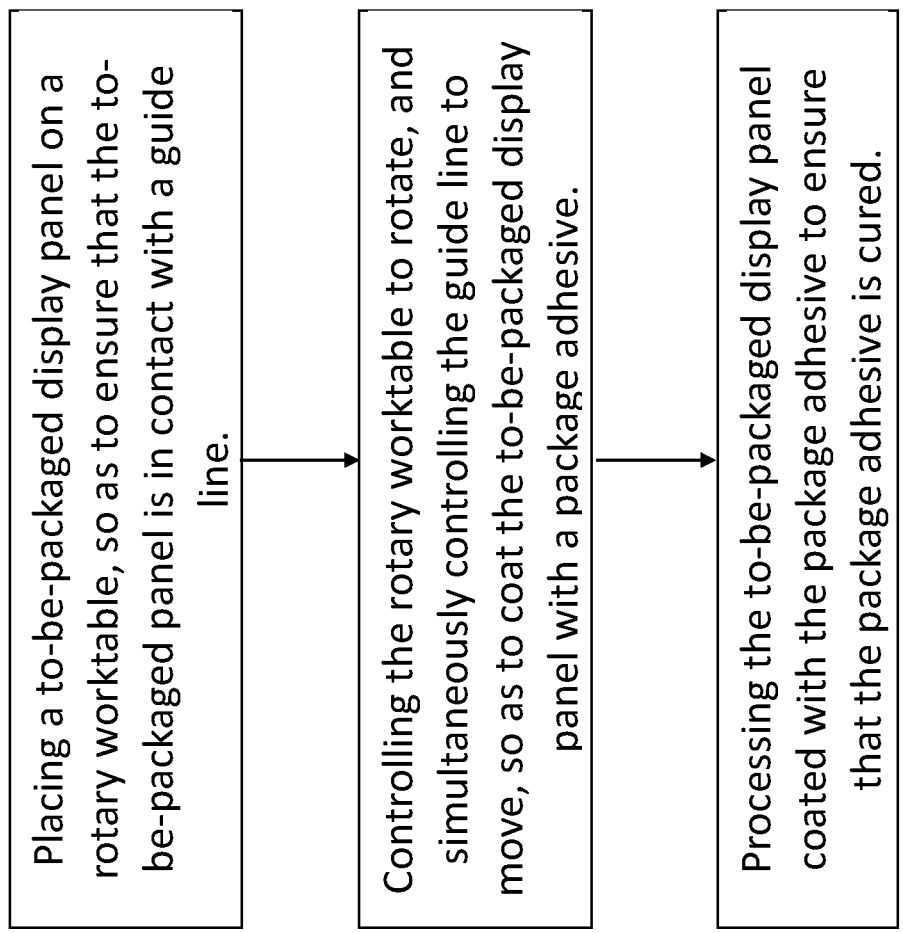
FIG. 5 is a flow chart of a display panel packaging method provided by an embodiment of the present disclosure.

FIG. 5 is a flow chart of a display panel packaging method provided by an embodiment of the present disclosure. The display panel packaging method is realized by the packaging device shown in any one of FIGS. 1 to 4. Referring to FIG. 5, the display panel packaging method includes the following step: placing a to-be-packaged display panel on a rotary worktable, so as to ensure that the to-be-packaged display panel is in contact with a guide line in step 201.

Herein, the display panel is an OLED display panel, and a frit of the to-be-packaged OLED display panel is in contact with the guide line.

The method shown in FIG. 5 further includes the following step: controlling the rotary worktable to rotate, and simultaneously controlling the guide line to move, so as to coat the to-be-packaged display panel with a package adhesive in step 202.

Exemplarily, the frit of the to-be-packaged OLED display panel is coated with the package adhesive.

In an implementation of an embodiment of the present disclosure, the step of controlling of the rotary worktable to rotate includes the following step: controlling the rotary worktable to rotate at a constant speed when the to-be-packaged display panel is round; and controlling the rotary worktable to rotate intermittently by 90 degrees every time when the to-be-packaged display panel is square. The display panel packaging method is applicable to display panels in different shapes.

Furthermore, in an embodiment of the present disclosure, the speed of the guide line is controlled by controlling the rotational speed of a rotating member. Exemplarily, the control unit is also used to control a power unit that drives a rotating wheel, so as to control the rotational speed of the rotating member. During the actual control, the rotational speed of the rotating member and the speed or intermittent time of the rotary worktable may be designed according to actual coating of the package adhesive, so as to ensure an appropriate coating amount of the package adhesive.

Furthermore, the rotary worktable may also be controlled to be away from the guide line in an intermittent period when it is controlled to rotate intermittently, thereby preventing the square to-be-packaged OLED device from squeezing the guide line at a corner during a next rotation and causing the guide line to wear or even fractured.

The method shown in FIG. 5 further includes the following step: processing the to-be-packaged display panel coated with the package adhesive to ensure that the package adhesive is cured in step 203.

Exemplarily, the package adhesive may be a UV adhesive. The processing of to-be-packaged display panel coated with the package adhesive can be, for example, the light treatment of the to-be-packaged display panel coated with the package adhesive, so as to cure the UV adhesive.

When the packaging device provided by the embodiments of the present disclosure works, a to-be-packaged display device (for example, a to-be-packaged OLED device) is disposed on the rotary worktable, so that the guide line is in contact with the frit on the to-be-packaged display device. When the rotary worktable rotates and the guide line moves, part of the guide line passes through the container that contains the package adhesive during a movement process, thus package adhesive contained in the container is adhered onto the guide line after the guide line passes through the container. When the part, to which the package adhesive is adhered, of the guide line passes over the rotary worktable, the frit is coated with the packaging adhesive and filled through the surface tension of the frit. Under the action of surface tension of the frit, the adhesive amount between the guide line and the frit reaches a state of dynamic balance, so as to realize the uniform coating of the package adhesive, such that the packaging mechanical strength and the sealing performance of the OLED device are improved. In addition, the round OLED device is placed on the rotary worktable, so that the package can be completed by using the package adhesive. That is, the packaging device is applicable to the round OLED device. Of course, the packaging device may also be applicable to elliptical OLED devices and other OLED devices with curved side surfaces.

The foregoing descriptions are merely some exemplary embodiments of the present disclosure, and are not intended to limit the present disclosure. Any modifications, equivalent substitutions, improvements, etc. within the spirit and principles of the disclosure shall fall into the protection scope of the present disclosure.

What is claimed is:

1. A packaging device, comprising:
a guide line, a container configured to contain a package adhesive, a rotary worktable configured to place a to-be-packaged device, and a winding device configured to drive the guide line to move, wherein the guide line is mounted on the winding device, and part of the guide line is configured to be immerged into the package adhesive, so that the guide line to which the package adhesive is adhered passes through the rotary worktable when moving.

2. The packaging device according to claim 1, wherein the winding device comprises at least two rotating members, both ends of the guide line are connected to each other, the guide line is configured to move under drive of the at least two rotating members, and the container is disposed on a movement path of the guide line.

3. The packaging device according to claim 2, wherein the rotary worktable is disposed on the movement path of the guide line.

4. The packaging device according to claim 2, further comprising: a recovery unit configured to recover the package adhesive on the guide line and disposed on the movement path of the guide line.

5. The packaging device according to claim 4, wherein the recovery unit comprises a tank body and two rollers that are disposed in parallel, the guide line is sandwiched between the two rollers, length directions of rotation axes of the two rollers are perpendicular to a movement direction of the guide line when the guide line passes through the recovery unit, and the two rollers are located above the tank body.

6. The packaging device according to claim 2, wherein the at least two rotating members comprise at least one rotating wheel and at least one guiding wheel, the rotating wheel is configured to rotate under drive of a power unit, and the guiding wheel is configured to rotate under drive of the guide line.

7. The packaging device according to claim 1, wherein a pulley is disposed in the container, and the guide line passes around the pulley.

8. The packaging device according to claim 7, wherein the pulley is disposed at a bottom of the container, and a distance between the pulley and the bottom of the container is less than a distance between a through hole and the bottom of the container.

9. The packaging device according to claim 7, wherein two through holes are oppositely formed in a side wall of the container, and the guide line sequentially passes one of the two through holes, the pulley and the other one of the two through holes.

10. The packaging device according to claim 1, wherein the guide line is a silk line.

11. The packaging device according to claim 1, wherein the guide line is a round line or a flat line.

12. The packaging device according to claim 11, wherein the guide line has a diameter of about 0.5 mm when the guide line is the round line, and the guide line has a width of about 0.5 mm when the guide line is the flat line.

13. The packaging device according to claim 1, further comprising a control unit configured to control the rotary worktable to rotate.

14. The packaging device according to claim 13, wherein the control unit is configured to control the rotary worktable to rotate at a constant speed when the to-be-packaged device is in a round shape, and to control the rotary worktable to rotate intermittently by 90 degrees every time when the to-be-packaged device is in a square shape.

15. The packaging device according to claim 13, wherein the control unit is further configured to control the winding device to move, so as to control a movement of the guide line.

16. A display panel packaging method realized by a packaging device including a guide line, a container configured to contain a package adhesive, a rotary worktable configured to place a to-be-packaged display panel, and a winding device configured to drive the guide line to move, wherein the guide line is mounted on the winding device, and part of the guide line is configured to be immerged into the package adhesive, comprising:
placing the to-be-packaged display panel on the rotary worktable to ensure that the to-be-packaged display panel is in contact with the guide line;
controlling the rotary worktable to rotate, and simultaneously controlling the guide line to move, so as to coat the to-be-packaged display panel with a package adhesive; and
processing the to-be-packaged display panel coated with the package adhesive, so as to ensure that the package adhesive is cured.

17. The display panel packaging method according to claim 16, wherein the controlling the rotary worktable to rotate comprises:
controlling the rotary worktable to rotate at a constant speed when the to-be-packaged display panel is in a round shape; and
controlling the rotary worktable to rotate intermittently by 90 degrees every time when the to-be-packaged display panel is in a square shape.

18. The display panel packaging method according to claim 16, wherein the display panel is an organic light-emitting display panel.

19. The packaging device according to claim 8, wherein heights of the through holes are higher than a liquid level of package adhesive.

20. The packaging device according to claim 3, wherein the at least two rotating members comprise at least one rotating wheel and at least one guiding wheel, the rotating wheel is configured to rotate under drive of a power unit, and the guiding wheel is configured to rotate under drive of the guide line.

\* \* \* \* \*